United States Patent [19]
Lin et al.

[11] Patent Number: 5,627,838
[45] Date of Patent: May 6, 1997

[54] AUTOMATIC TEST CIRCUITRY WITH NON-VOLATILE STATUS WRITE

[75] Inventors: Tien-Ler Lin, Cupertino; Tom D. Yiu; Ray L. Wan, both of Milpitas; Kong-Mou Liou, San Jose, all of Calif.

[73] Assignee: Macronix International Co., Ltd., Hsinchu, Taiwan

[21] Appl. No.: 129,419

[22] Filed: Sep. 30, 1993

[51] Int. Cl.$^6$ .................................................. G11C 29/00
[52] U.S. Cl. ................... 371/21.1; 365/201; 365/185; 365/185.18; 365/185.09; 365/185.29
[58] Field of Search .................... 371/21.1, 10.1, 371/19.1, 15.1, 16.1, 40.1, 5.1, 5.3, 5.5; 365/201, 200, 185, 185.09, 185.18, 185.29; 395/575; 364/550, 565

[56] References Cited

U.S. PATENT DOCUMENTS

| | | | |
|---|---|---|---|
| 4,875,188 | 10/1989 | Jungroth | 365/185 |
| 4,958,352 | 9/1990 | Noguchi et al. | 371/40.1 |
| 5,163,021 | 11/1992 | Mehrotra et al. | 365/185 |
| 5,260,949 | 11/1993 | Hashizume et al. | 371/22.3 |
| 5,263,204 | 11/1993 | Ashmore, Jr. | 365/200 |
| 5,267,204 | 11/1993 | Ashmore, Jr. | 365/200 |
| 5,327,435 | 7/1994 | Warchol | 371/16.1 |
| 5,369,647 | 11/1994 | Kreifels et al. | 371/25.1 |
| 5,375,222 | 12/1994 | Robinson et al. | 395/425 |

FOREIGN PATENT DOCUMENTS

PCT/US93/
09317  9/1993  WIPO .

Primary Examiner—Robert W. Beausoliel, Jr.
Assistant Examiner—Phung My Chung
Attorney, Agent, or Firm—Wilson, Sonsini, Goodrich & Rosati

[57] ABSTRACT

An integrated circuit (IC) includes a functional module such as FLASH memory with automatic program and erase circuits, test circuitry coupled with the functional module which executes a test of the functional module and generates status information as a result of the test, and non-volatile status write circuitry coupled with the test circuitry on the chip. A circuit in the non-volatile status write circuitry is responsive to the test of the functional circuitry to write the status information to the non-volatile memory. A port on the integrated circuit is coupled to the non-volatile memory through which the status information stored in the non-volatile memory is accessible in a test read mode to external devices. In a FLASH EPROM embodiment, the IC includes an array of FLASH EPROM memory cells, a test set of FLASH EPROM memory cells, and a port through which data in the array is accessible by external devices. Program and erase circuitry, coupled to the array, has a test mode to exercise the program and erase circuitry to generate status information indicating results of the test and test read mode to read out the status information. Non-volatile status write circuitry is coupled to the program and erase circuitry and the test set, and writes the status information to the test set. The program and erase circuits include retry counts with programmable thresholds for reducing the test times of the devices.

13 Claims, 13 Drawing Sheets

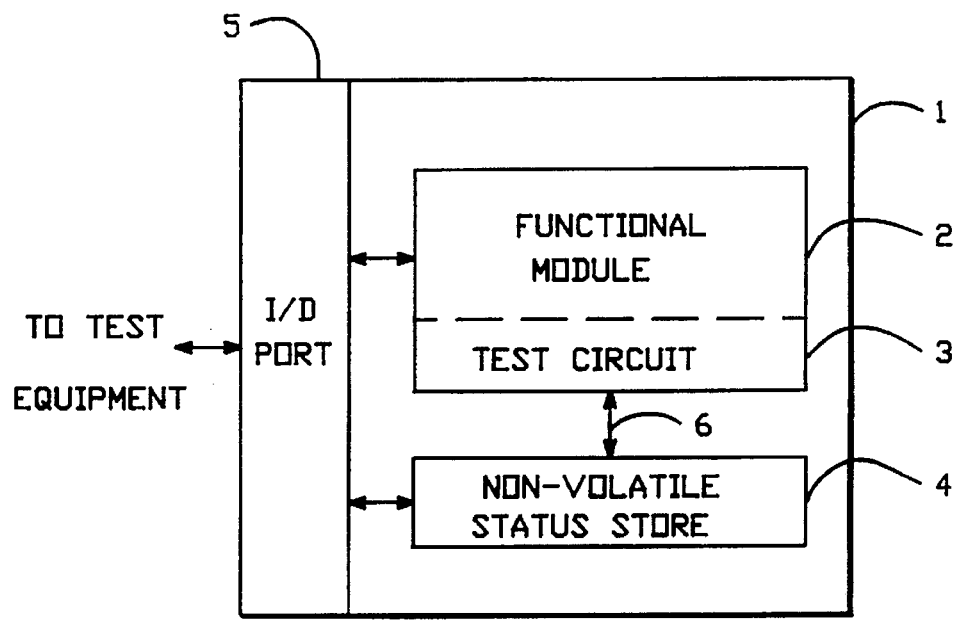
FIG.—1
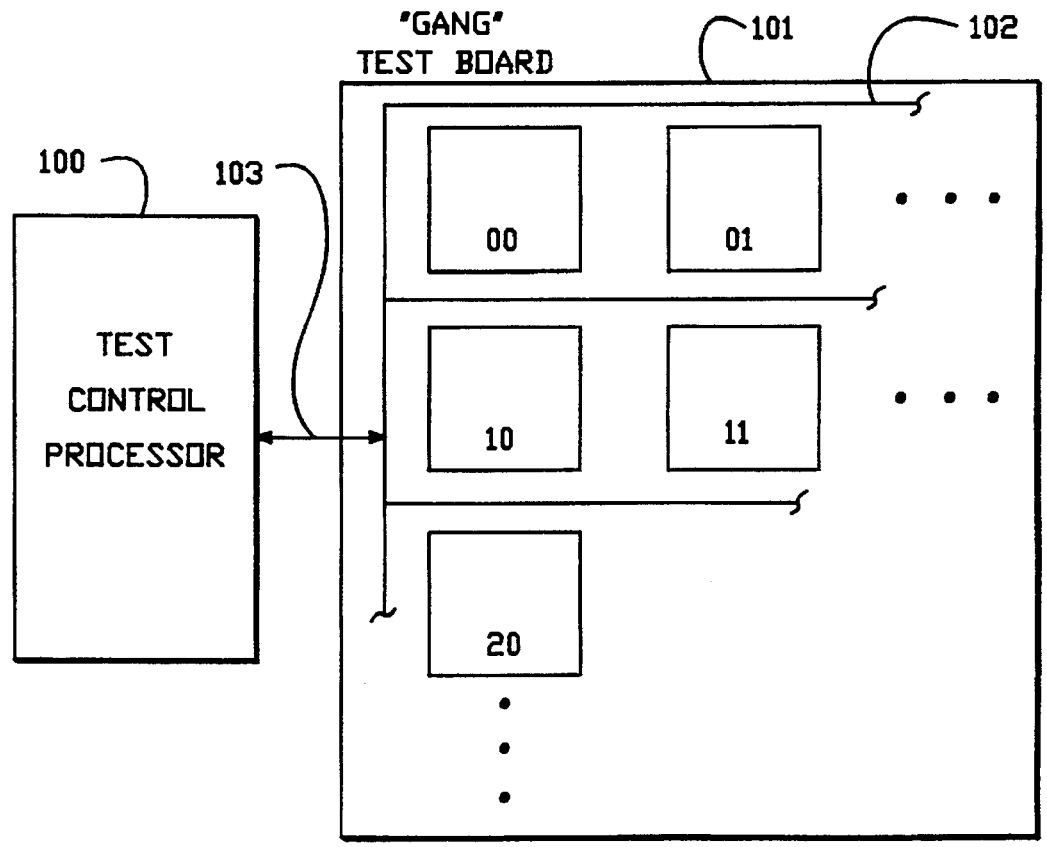
FIG.—2

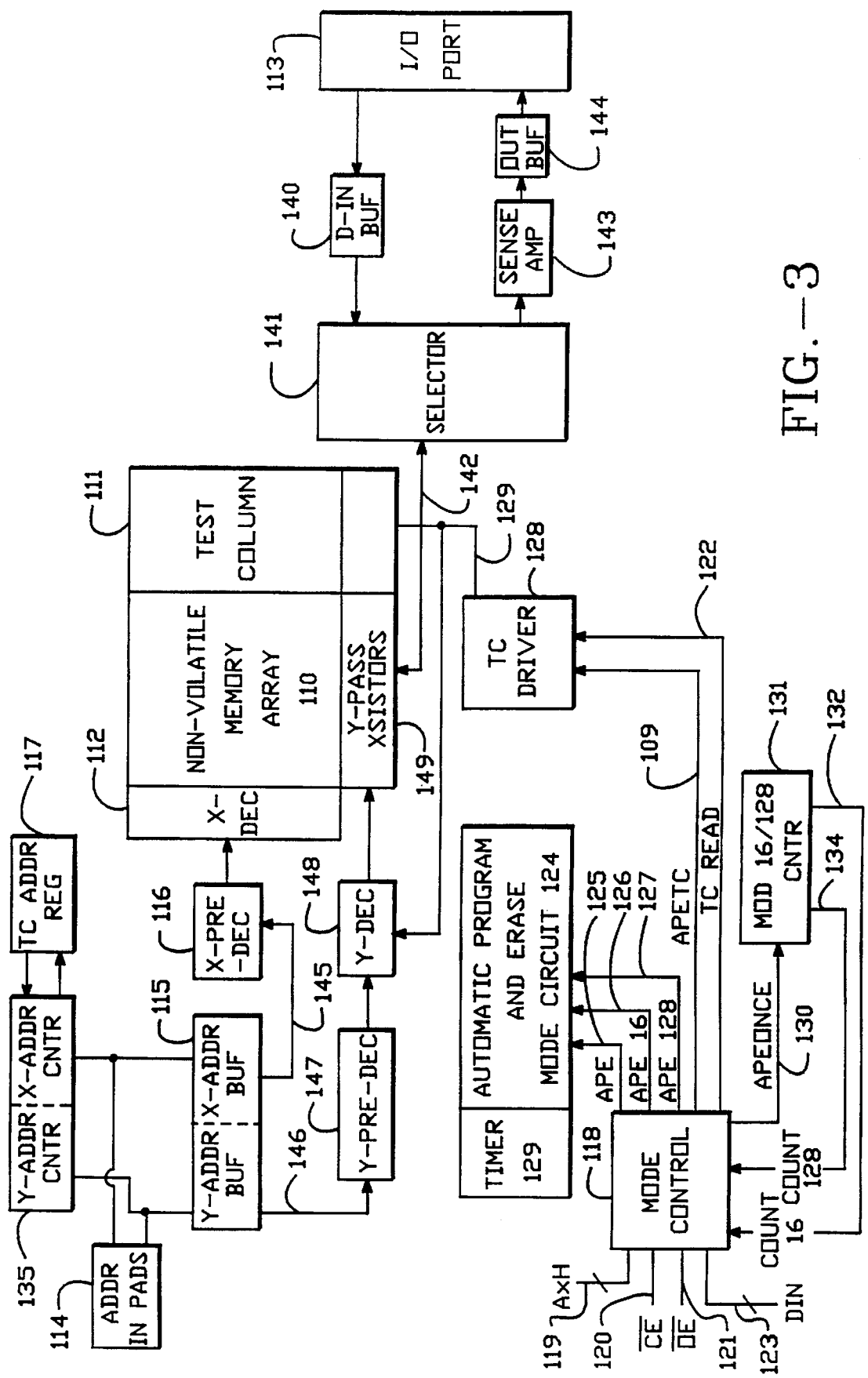
FIG.—3

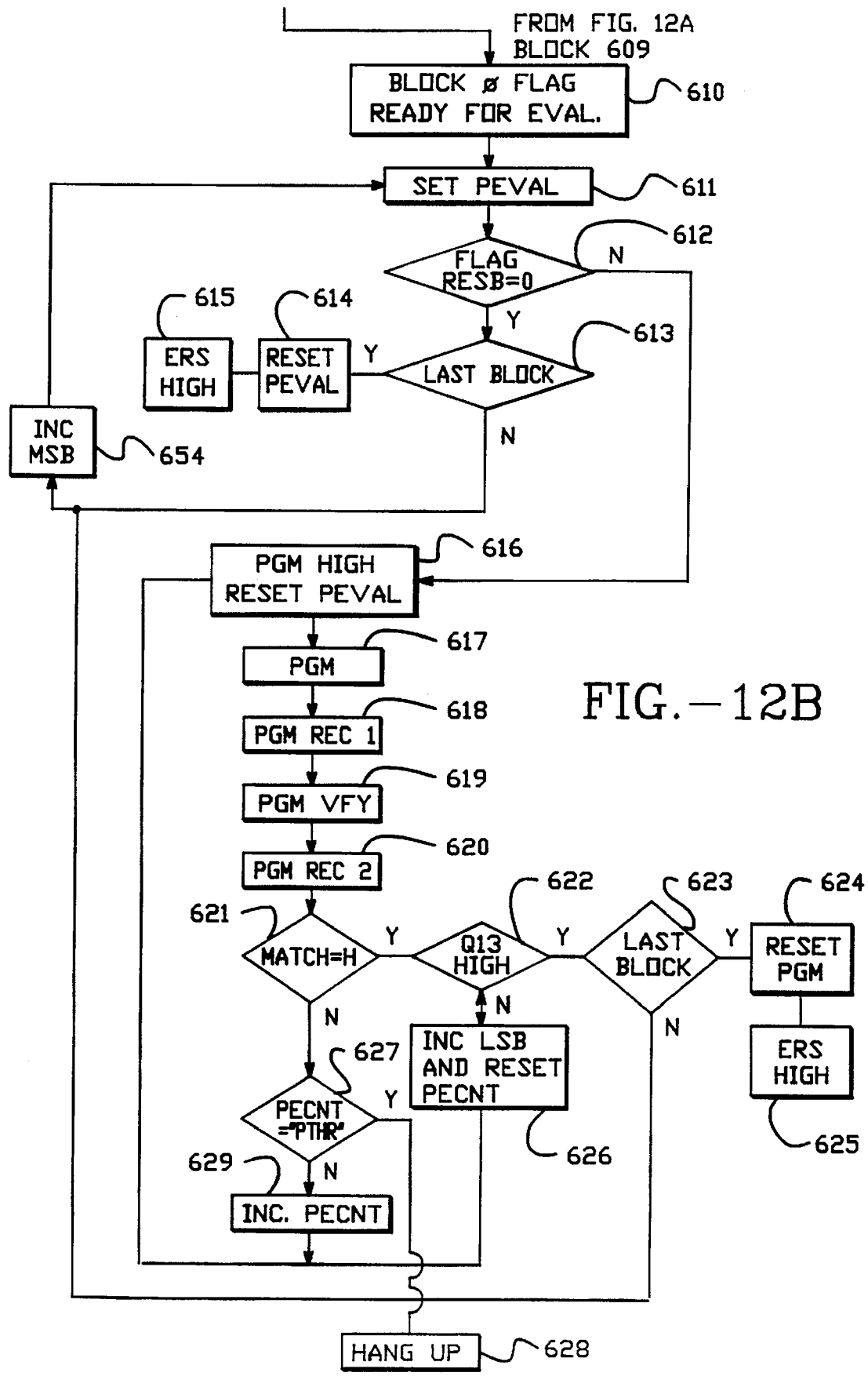
FIG.—12B

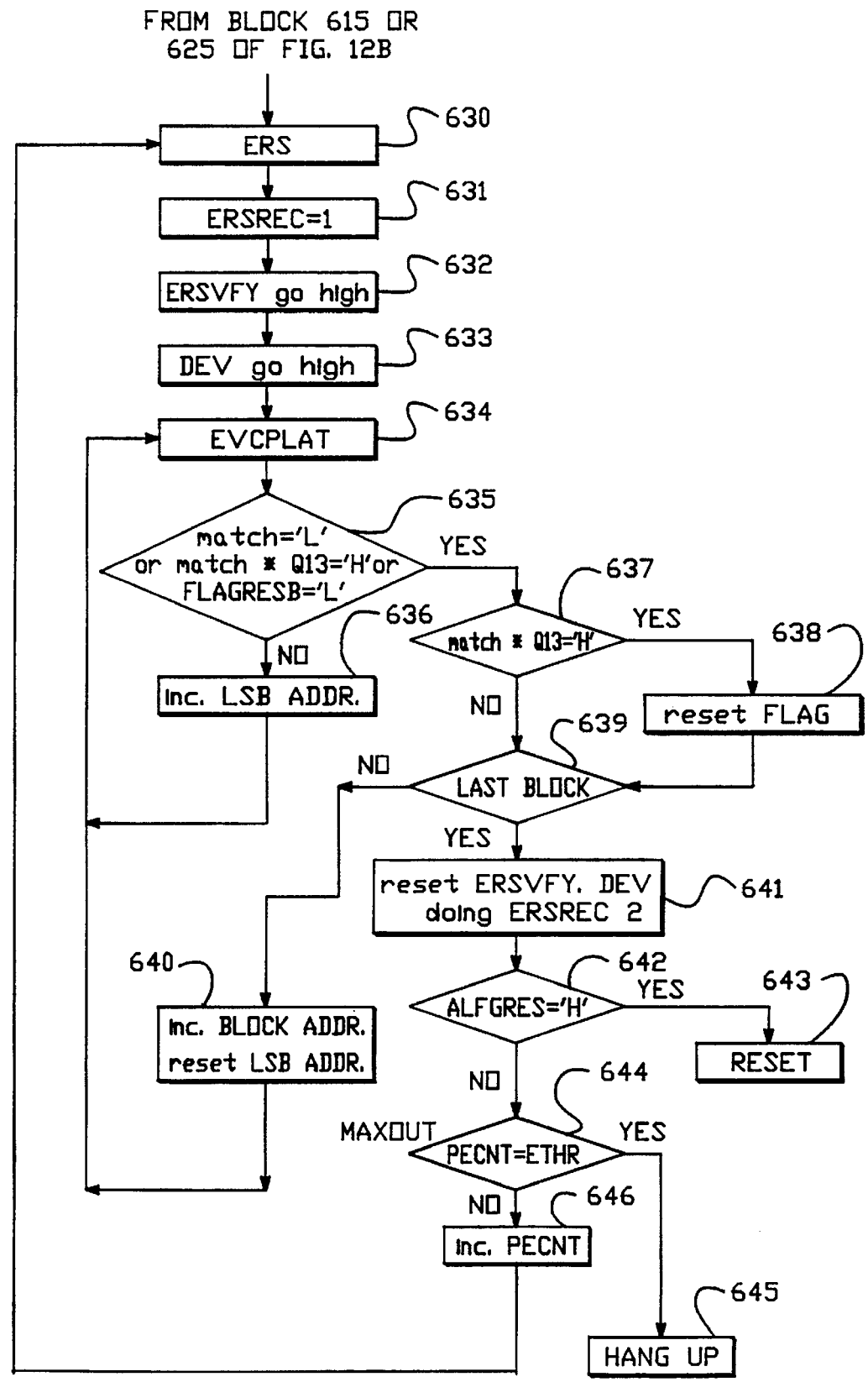
FIG.—12C

AUTOMATIC TEST CIRCUITRY WITH NON-VOLATILE STATUS WRITE

BACKGROUND OF THE INVENTION

1. Field of the Invention

The present invention relates to the manufacture and testing of integrated circuits; and more particularly to circuits to test integrated circuits such as EEPROMs or FLASH EPROMs for engineering and production purposes.

2. Description of Related Art

In the manufacture of integrated circuits, testing for both engineering and production purposes is critical. Thus, most integrated circuits incorporate test circuitry on the chip to facilitate the testing processes. The ability to test a large number of devices at one time is particularly important for production purposes, where the testing step is incorporated into the method for manufacturing the integrated circuit. In production testing systems for "gangs" of integrated circuits, the amount of data which must be monitored by a processor controlling the testing can be quite large. This slows down the testing processes, and limits the amount of information which can be processed during the testing mode.

Testing is of significant importance in the non-volatile memory device field. For instance, the memory devices must be tested for endurance, and qualified according to read and write speed specifications during manufacturing. Also, the endurance and read and write speed parameters of the circuit are important for engineering purposes during the design of a product.

Non-volatile memory design based on integrated circuit technology represents an expanding field. One popular class of non-volatile memory cell is known as the erasable-programmable read only memory (EPROM). Two popular EPROM designs are distinguished in the manner in which isolation of the memory cells is carried out. The first is referred to as the EEPROM. A second member of this class is known as the FLASH EPROM which uses a higher density format.

Both the FLASH EPROM and EEPROM technologies are based on a memory cell which consists of a source, channel, and drain with a floating gate over the channel and a control gate isolated from the floating gate. The act of programming the cell involves charging the floating gate with electrons which causes the turn-on threshold of the memory cell to increase. Thus, when programmed the cell will not turn on, that is it will remain non-conductive, when addressed with a read potential applied to its control gate. The act of erasing the cell involves removing electrons from the floating gate to lower the threshold. With the lower threshold, the cell will turn on to a conductive state when addressed with a read potential to the control gate.

The regular EEPROM designs use either a two transistor cell structure which includes a pass gate that isolates the memory cell from the bitline or a split-gate structure which behaves like two transistors in series to isolate un-selected cells, so that unselected memory cells do not contribute leakage current to the bitline. The higher density FLASH EPROM cell does not use the isolation transistor or split-gate.

Further, commercial FLASH EPROM designs include circuitry for verifying the success of programming and erasing steps. See, for instance, U.S. Pat. No. 4,875,118, entitled VOLTAGE MARGINING CIRCUIT FOR FLASH EPROM, invented by Jungroth.

Also, commercial devices incorporate automatic program and erase modes which can be used for testing the operation of the non-volatile design.

In order to meet specific quality requirements for non-volatile memory devices like FLASH EPROMs and EEPROMs, program and erase cycling is required to screen out devices which have low endurance (i.e., suffer "infant mortality"). To simplify the hardware requirements for the testing and reduce the cycle time, gang cycling is required in the production environment. Thus, it would be desirable to provide an automatic program and erase mode with some intelligence to facilitate gang cycling. For engineering, it is also important to have a mode that will record the status of the device during cycling to indicate the endurance of the specific device.

SUMMARY OF THE INVENTION

The present invention provides an integrated circuit which comprises a functional module, test circuitry coupled with the functional module which executes a test of the functional module and generates status information as a result of the test. Non-volatile status write circuitry is coupled with the test circuitry on the chip, and includes non-volatile memory. A circuit in the non-volatile status write circuitry is responsive to the test of the functional circuitry to write the status information to the non-volatile memory. A port is provided on the integrated circuit coupled to the non-volatile memory through which the status information stored in the non-volatile memory is accessible to external devices.

The non-volatile memory in the non-volatile status write circuitry may comprise a variety of non-volatile memory cell structures, such as EPROM, EEPROM, and FLASH EPROM.

According to one aspect of the present invention, the integrated circuit functional module comprises a memory, and the test exercises the write circuitry coupled with the memory to test the speed and/or endurance of the memory cells.

The non-volatile status write memory according to a preferred system includes a plurality of memory cells used to store an indication of the number of times the memory cells in the memory have been tested. This number will indicate the endurance of the cell, by providing information to the testing engineers about how many cycles the memory endured before failure. Also, the memory can be used to store status information which indicates whether the integrated circuit passes a specific threshold number of cycles to filter circuits which have low endurance during the testing mode of manufacture.

According to another aspect of the invention, the number of times the memory cells are to be tested by exercises of the write circuitry for the memory during the production mode is programmable according to user input.

According to yet another aspect of the present invention, a FLASH EPROM integrated circuit is provided. The FLASH EPROM includes an array of FLASH EPROM memory cells and a port through which data in the array is accessible by external devices. A test set of FLASH EPROM memory cells is provided in the array. Program and erase circuitry, coupled to the array, has a test mode to exercise the program and erase circuitry to generate status information indicating results of the test of cells in memory array. Non-volatile status write circuitry, is coupled to program circuitry and the test set, and writes the status information to the test set. In another test mode, read circuitry is enabled to read out the status information through the data port.

The test control circuitry is responsive to mode control inputs to select particular test exercises. The circuitry for accessing the test column in response to the test mode includes logic that enables access to the test set during the test mode, a test column address register coupled to the program circuitry to address memory cells in the test set in response to a count of the plurality of exercises, and circuits coupled to the test set to supply data indicating the status of particular exercises in the test mode to corresponding memory cells in the test set.

According to yet a further aspect of the present invention, a FLASH EPROM integrated circuit is provided in which the program and erase circuitry includes automatic program and program verify control loop, and an automatic erase and erase verify control loop. The automatic program and program verify control loop includes logic to retry a programming exercise in response to failure of program verify, and a program retry counter to count retries up to a program retry threshold and signal failure of the programming exercise if the program retry threshold is reached. The automatic erase and erase verify control loop also includes logic to retry an erasing exercise in response to failure of erase verify. An erase retry counter counts retries up to an erase retry threshold and signals failure of the erasing exercise if the erase retry threshold is reached. Logic is provided by which the user may program the program retry threshold and the erase retry threshold in response to user input. This capability is important for engineering evaluation purposes and to cut down wafer test time of FLASH EPROMs and other non-volatile memory designs.

The present invention can also be characterized as a method for manufacturing integrated circuits. The method includes (1) integrating the non-volatile status write memory on the integrated circuit, (2) executing tests of the functional modules in the integrated circuits, (3) storing information indicating results of the tests for each particular integrated circuit on the non-volatile status write memory of such particular integrated circuit, and (4) sorting the integrated circuits in response to the data stored in the non-volatile status write memory. The method can be extended to "gang cycling" techniques which involve the step of mounting a plurality of integrated circuits on a testing apparatus including a processor which automatically tests the plurality of integrated circuits.

Accordingly, the present invention provides an automatic program and erase mode for engineering purposes, and an automatic program and erase mode for production purposes that involves the use of non-volatile status write circuitry on integrated non-volatile memory devices. The technique is expandable to a wide variety of integrated circuits, and facilitates the testing of large numbers of such circuits with greater speed, and with greater amounts of status information generated by the test.

Other aspects and advantages of the present invention can be seen upon review of the figures, the detailed description, and the claims which follow.

BRIEF DESCRIPTION OF THE FIGURES

FIG. 1 is a schematic diagram of an integrated circuit incorporating the non-volatile status write circuitry according to the present invention.

FIG. 2 is a schematic diagram of a testing apparatus used in the production of integrated circuits according to the present invention.

FIG. 3 is a functional block diagram of a non-volatile memory integrated circuit incorporating the non-volatile status write circuitry according to the present invention.

FIGS. 12A–12C provide a detailed flow chart for the automatic pre-program and erase operation of the present invention.

DETAILED DESCRIPTION

Figure 4:
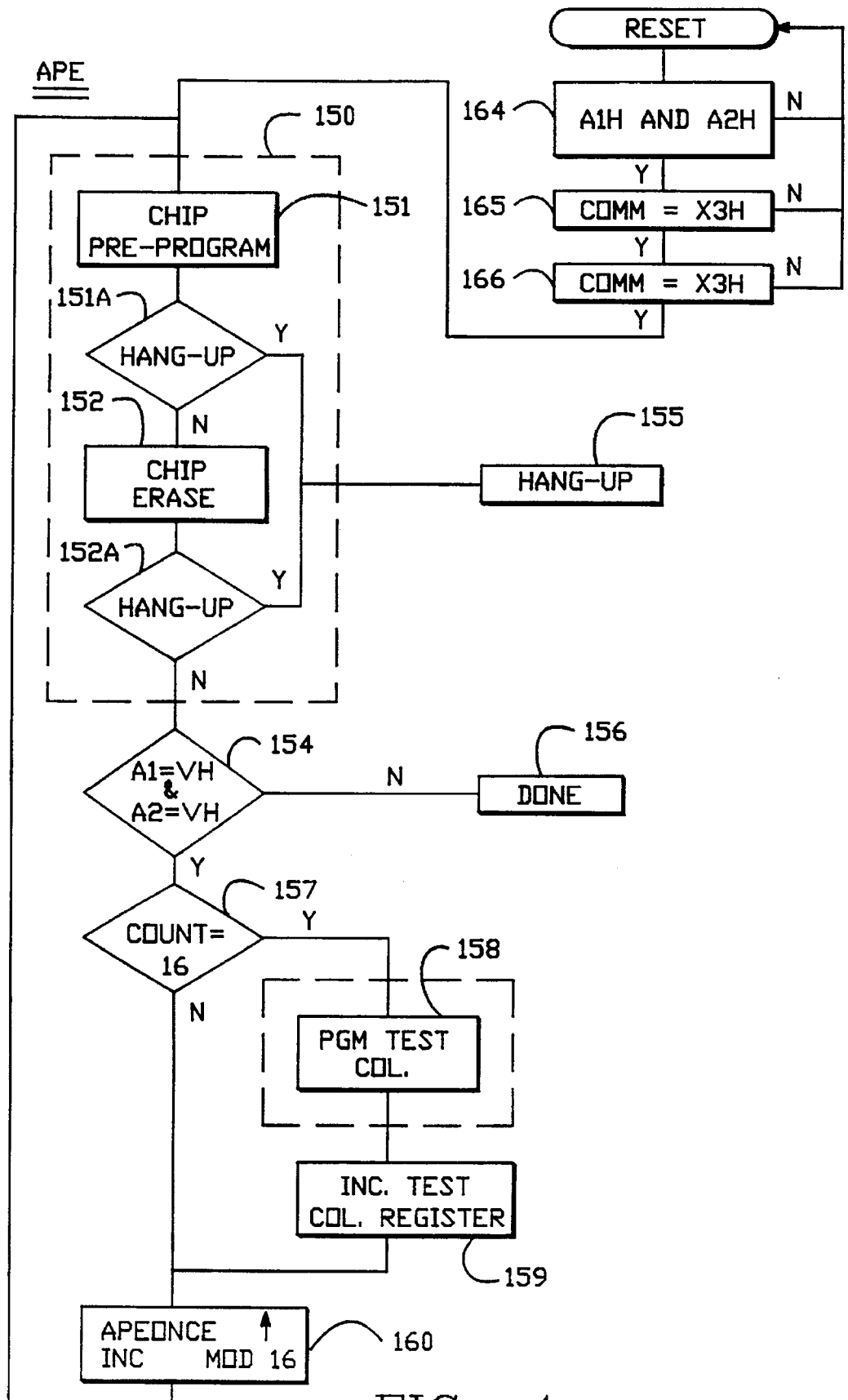
FIG. 4 is a flow chart illustrating the automatic program and erase cycling mode used for engineering purposes in the circuit of FIG. 3.

A detailed description of preferred embodiments of the present invention is provided with respect to FIGS. 1–13. FIGS. 1 and 2 illustrate the basic environment of an integrated circuit using non-volatile status write circuitry according to the present invention. FIGS. 3–13 describe an implementation of a FLASH EPROM integrated circuit, and a method for testing the same for production and engineering purposes according to the present invention.

FIG. 1 illustrates an integrated circuit, generally 1, which includes a functional module 2. Coupled with the functional module 2 is a test circuit 3. A non-volatile status store 4 is coupled with the test circuit across line 6 to store status information indicating results of the test executed by the test circuit 3 in non-volatile memory. The integrated circuit 1 includes an I/O port 5 through which external devices may have access to the non-volatile status store 4. The I/O port 5 may also be shared by the functional module 2 of the integrated circuit using techniques known in the art.

By incorporating a non-volatile status store 4 in an integrated circuit 1, as shown in FIG. 1, the test circuit 3 may incorporate significant intelligence, without requiring an external device to receive the results of tests in real time. Thus, this design facilitates the gang cycling of integrated circuits, as illustrated in FIG. 2.

FIG. 2 heuristically illustrates a mechanism used during manufacture of an integrated circuit according to the present invention. This mechanism includes a test control processor 100 and a test board 101 for gang testing of integrated circuits. The integrated circuits are arranged on the board 101 in an array including circuit 00, circuit 01, circuit 10, circuit 11, circuit 20, and other circuits arranged on the device in rows and columns. The board 101 includes a test bus 102 which is coupled to the integrated circuits in the array on the board 101. The test control processor communicates with the bus 102 across line 103. Using an integrated circuit implemented as shown in FIG. 1, the test control processor may control the integrated circuits to execute tests in parallel, with the results of the tests being stored in non-volatile memory on each integrated circuit. Later, the data stored in the non-volatile status stores on the chips can be scanned out for analysis by the test control processor. This process eliminates the need to test and receive the status information generated by the test for each circuit in series. Furthermore, the non-volatile status store in each integrated circuit may store significantly more data, indicating a variety of aspects of the test results which is unavailable in prior art systems due to the speed requirements of gang testing of integrated circuits.

FIG. 3 is a functional block diagram of a non-volatile memory device implemented according to the present invention.

The device includes a non-volatile memory array 110. The array includes a plurality of rows and columns (not shown). One of the columns is referred to as a test column 111 which can be selected by the X-address only during test modes, for non-volatile status write during all APE (Automatic Program and Erase) modes and for read out of status information during a test column read mode. An X-decoder 112 is coupled to the array 110 and drives wordlines along the rows of the array. An I/O port schematically shown at 113, provides access to data in the array, including the data in the test column 111. The I/O port 113 is coupled through data-in buffer 140 and selector 141 to data line 142 of the array 110, and to data line 142 through selector 141, sense amps 143 and data-out buffer 144. The array is addressed through address input pads 114 which are coupled to an address buffer 115. The outputs of the address buffer 115 include an X-address on line 145 supplied to an X pre-decoder 116 which drives the X-decoder 112 using techniques known in the art. The address buffer 115 supplies a Y-address on line 146, to Y pre-decoder 147, and Y-decoder 148 to column select Y-pass transistors 149 in the array 110.

Figure 6:
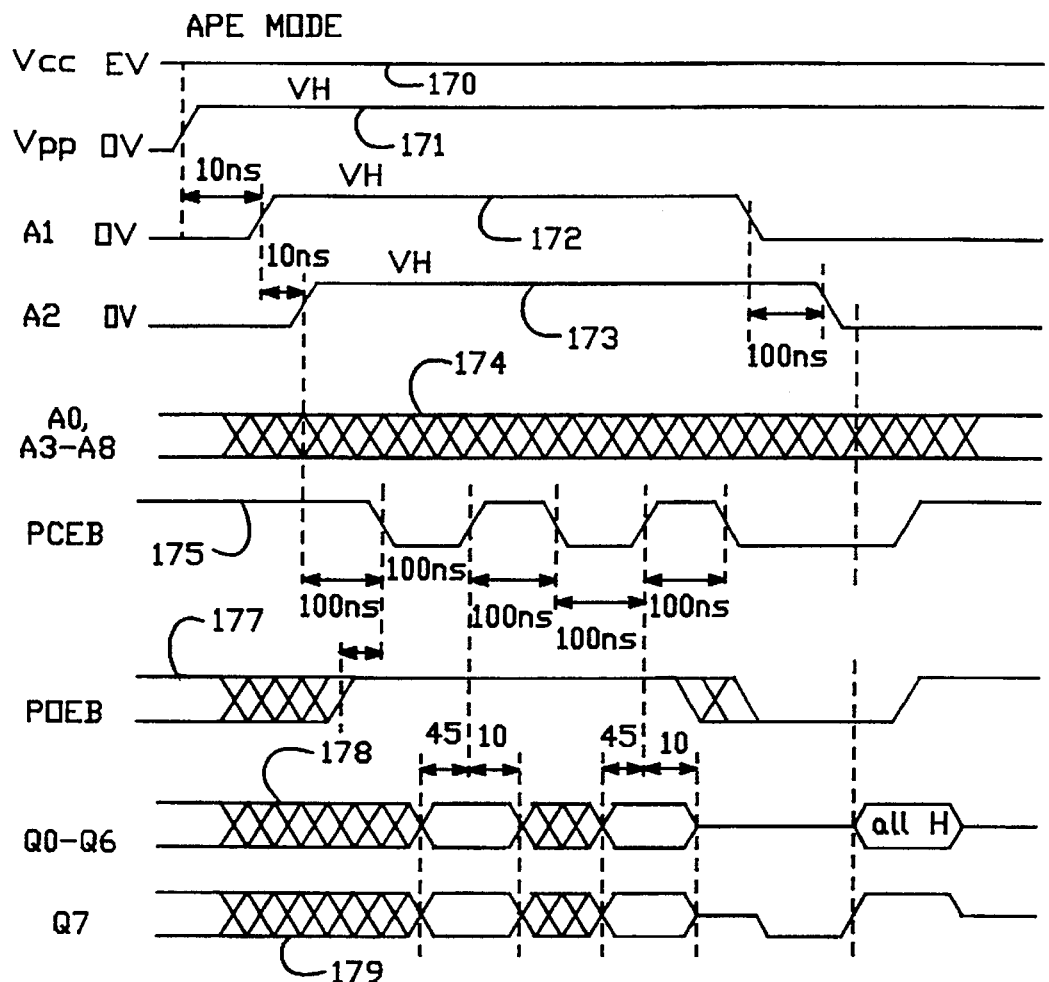
FIG. 6 is a timing diagram illustrating the programming of the automatic programming and erase cycling modes according to the present invention.
Figure 7:
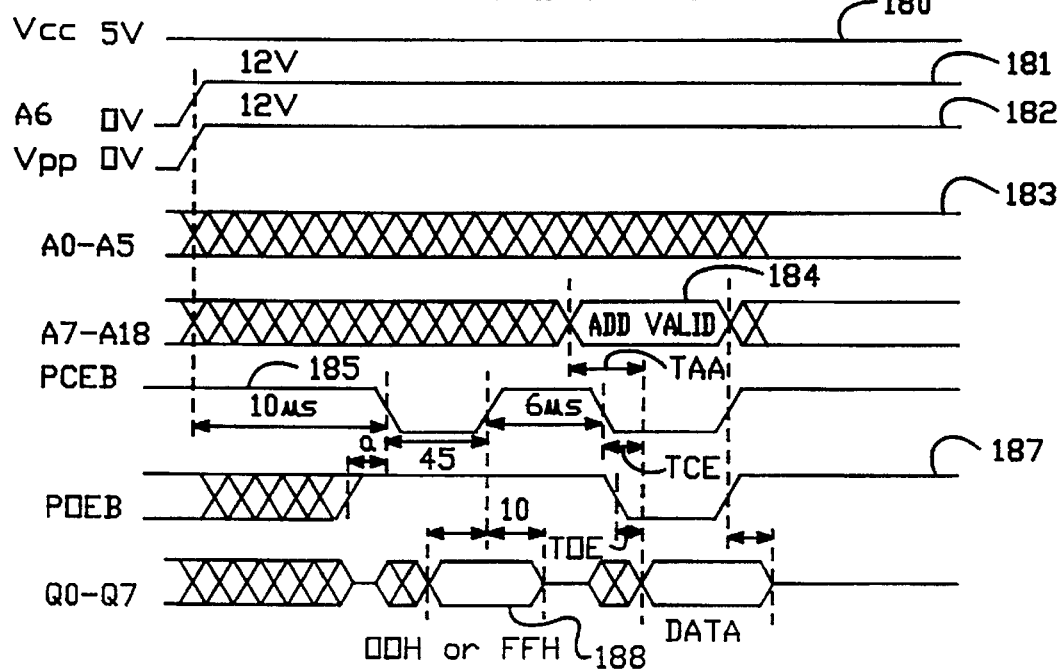
FIG. 7 is a timing diagram illustrating the test column read sequence for the integrated circuit according to the present invention.

The non-volatile memory array also includes mode control logic 118 which is coupled to receive the address high voltage signals A×H on line 119 as input, a chip enable signal on line 120, an output enable signal on line 121 (if needed), and data in signals on line 123. Mode control logic is used to control the mode of operation of the integrated circuit. According to the preferred embodiment, the user modes include at least a program mode, an erase mode, and a read mode. Test modes include three automatic program and erase (APE) test modes and test column read mode. The modes are selected in response to the inputs on lines 119, 120, 121, and 123 using techniques well known in the art, as modified to include the test modes responsive to address high voltages as shown in FIGS. 6 and 7. (See, e.g., Am28F020 Flash Memory chip manufactured by Advanced Micro Devices, Inc., of Sunnyvale, Calif.)

Coupled with the mode control logic 118 is an automatic program and erase circuit 124, which includes all the circuit necessary for programming and erasing the cells in the non-volatile memory array. See co-pending PCT applications entitled FAST FLASH EPROM PROGRAMMING AND PRE-PROGRAMMING CIRCUIT DESIGN, invented by Tom D. Yiu, et al., having Ser. No. PCT/US93/05117, and filed date May 28, 1993; and FLASH EPROM WITH BLOCK ERASE FLAGS FOR OVER-ERASE PROTECTION, invented by Tien-Ler Lin, et al., having Ser. No. PCT/US93/05146, and Filed Date May 28, 1993.

According to a preferred implementation, the mode control logic 118 includes three different test APE modes, including a free-running APE mode as signalled on line 125, an APE mode which executes 16 APE cycles, as indicated on line 126, and an APE mode which executes 128 APE cycles, as indicated on line 127. Also, a test column read mode is signaled on line 122. During assertion of the signals on lines 125, 126, or 127 an APE test column enable signal APE TC is supplied on line 109 to a test column driver 128 during test column programming which provides data on line 129 to the test column 111 and disables the Y-decoder 148 to cause programming of the test column 111 in response to X-address identified in TC register 117. Also, a timer 129 is coupled to the APE mode circuits 124.

An APEONCE signal on line 130 is generated by the mode control logic 118 during the APE cycling. This signal is used to increment a mod16/128 counter 131. The mod16/128 counter 131 generates a count16 signal on line 132 and a count 128 signal on line 134 which are sent to the mode control logic 118.

Figure 5:
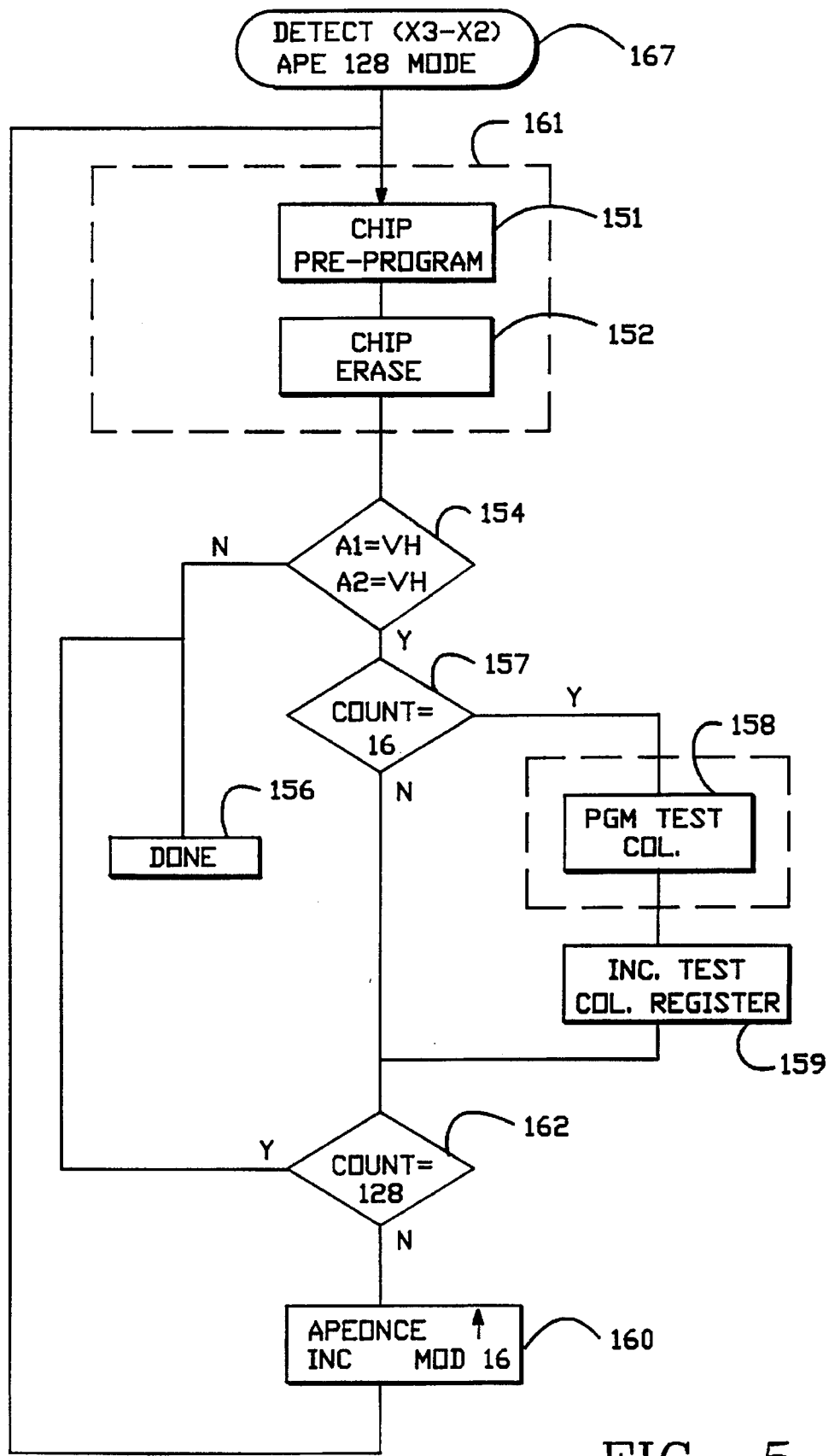
FIG. 5 is a flow chart of the automatic programming and erase cycling mode processing used for production purposes in the circuit of FIG. 3.

A TC register 117 is coupled to the address counter 135 for supplying wordline address bits during APE cycling to identify the proper location in the test column 111 for status write for every 16 program erase cycles in the algorithm of FIGS. 4 and 5. The value in the TC register 117 is dumped into address counter 135 during the APE processing, and through the address counter 135 to the address buffer 115. This value is initialized at zero and used for addressing the particular memory cell in the test column 111 for a particular exercise of the program and erase circuitry. On each access, the address counter 135 increments by one, and returns the incremented value to the TC register 117. Thus, for each 16 cycle exercise, a new row in the non-volatile memory array test column 111 is addressed for writing the status information.

FIGS. 4 and 5 illustrate, respectively, the free-running APE process for engineering purposes, and the production APE process with a fixed number of cycles, executed by the mode control logic 118 according to the present invention. In FIG. 4, the algorithm begins in a reset state 163. The mode control logic monitors address lines A1 and A2 for high voltage A1H and A2H (block 164). After A1H and A2H are detected, the mode control logic monitors the data in line for a sequence of X3H—X3H for free running APE as identified by blocks 165 and 166. Then the algorithm proceeds with a program and erase cycle 150 (details shown in FIGS. 10 and 12). The program and erase cycle 150 includes a chip pre-programming step 151 with program verify. If program verify fails, a hang-up condition is reached. Thus, the next step tests for the hang-up condition (block 151A). If no hang-up occurs during the pre-programming, then a chip erase cycle is executed (block 152). Again, chip erase cycling involves erase verify. If the chip fails erase verify, then a hang-up condition is entered. Thus, the next step in the algorithm involves testing for hang-up condition after chip erase (block 152A). If no hang-up is detected, then the algorithm proceeds to block 154. If a hang-up condition is detected in either blocks 151A or 152A, then the automatic program and erase cycle hangs up, as indicated at block 155.

The hang-up condition stops the APE process without resetting the chip mode.

If there is no hang-up during the automatic APE cycling 150, then the algorithm tests to insure that the address signals A1 and A2 remain at the high programming potential, indicating that the cycling is to continue. If not, then the algorithm is done (block 156). If the address lines remain high, then the algorithm tests the count16 signal generated at the output of the mod16 counter 131 in FIG. 3 (block 157).

If the count16 signal is asserted in block 157, then the test column is programmed by setting data to "0" (block 158).

The chip uses the automatic program routine without a hang-up mode, and the TC register 117 of FIG. 3 to program a particular cell in the test column for this testing exercise. After programming the test column in block 158, the TC register is incremented (block 159). Next, the APEONCE signal is asserted and the mod16 counter 131 is incremented (block 160). After block 160, the algorithm loops to the APE cycling 150. This loop continues while the address signals A1 and A2 are kept at the high programming potential by the test processor monitoring the test. Every 16 cycles, a test column address location is programmed to zero, until the loop hangs up, or the cycle is terminated in response to A1H or A2H.

FIG. 5 illustrates the APE cycling for a fixed count APE mode, such as the APE128 mode or the APE16 mode described with reference to FIG. 3. In FIG. 5, the APE 128 mode is described for example. The reference numbers used in FIG. 4 will be used for like blocks in FIG. 5. In FIG. 5, the algorithm begins with detecting the APE 128 mode (block 167) in a manner similar to blocks 163–166 of FIG. 4, with the data values modified to an X3–X2 sequence, for example. This initiates an APE cycle which does not include hang-up (block 161). The APE mode without hang-up uses a chip pre-program cycle 151 followed by a chip erase cycle 152.

After the APE cycle 161, the address signals A1 and A2 are tested (block 154). If one or the other is low, then the algorithm is done (block 156). If both signals remain high, then the mod16 counter is tested (block 157). If the count is equal to 16, then the test column is programmed (block 158) using the automatic program routine and the TC register. Next, the TC register is incremented (block 159). If the count in block 157 is not equal to 16, then the count128 signal is tested in block 162. If the count128 signal is not asserted, then the APEONCE signal is asserted and the mod16 counter is incremented (block 160). Then the algorithm loops back to the APE cycle 161. If at block 162, the count128 signal was asserted, then the algorithm loops to block 156 and is done. After the APE 128 mode is done, the test column contents are 000000001 . . . 111 (eight zeroes followed by all ones).

This mode is important for production mode manufacturing of integrated circuits, because of the varying lengths of time it may take for a given circuit in a gang of circuits to go through the pre-program and erase modes. Thus, the test circuitry can enable all of the chips in a gang to be APE cycled in parallel. After waiting long enough to insure that all the devices complete the process, the results can be read from the non-volatile status store in an efficient production mode operation to ensure that the devices have been cycled. With the engineering mode testing of FIG. 4, the device will hang-up upon the first failure. Thus, the data in the test column will indicate how many cycles were successfully completed before the first hang-up.

FIG. 6 is a timing diagram illustrating the sequence for programming the APE mode using the mode control logic 118. In order to enter the APE mode, the $V_{CC}$ power supply must be at 5 volts, as indicated at trace 170. Also, the programming high voltage $V_{PP}$ must be turned on as indicated at trace 171. Address signal A1 goes to a program potential at least 10 microseconds after the turn on of $V_{PP}$. Also, the address signal A2 goes high 10 microseconds after turn on of address A1, as indicated at traces 172 and 173. When A1 and A2 are asserted, the other address signals are in a don't care state, as indicated at trace 174. The chip enable signal goes low 100 microseconds after the A2 signal is asserted as indicated at trace 175. The output enable signal as indicated at trace 177 goes high disabling the outputs.

The mode is selected by asserting the data signals Q0–Q7 during the toggling of the chip enable signal indicated on line 175 as shown at lines 178 and 179. The symbol $$ is equal to X1(hex) to indicate the APE16 mode, it is X2(hex) to indicate the APE 128 mode, and it is X3(hex) to indicate the APE free running mode.

The APE16 mode is terminated when the number of APE cycles equals 16. The APE128 mode will be terminated when the number of APE cycles equals 128. The APE16 mode, APE128 mode, and APE free running mode are terminated when A1 or A2 VH voltage goes below the $V_{CC}$ level while the other A2 or A1 signal remains high. The device enters a reset state after finish of the cycling and with the whole chip in the erased state.

The test column read timing waveform as shown in FIG. 7 is used to read the test column. The test column read timing waveform is entered after the $V_{CC}$ voltage supply is high as indicated at 180. The address signal A6 and the $V_{PP}$ programming potential are asserted to the 12 volt programming potential, as indicated at lines 181 and 182, respectively. Address signals A0–A6 are in a don't care state, as indicated at line 183. Address signals A7–A18 are asserted during the window indicated at 184 to address a particular cell in the test column. This accessing is accomplished by manipulating the chip enable signal on line 185 and the output enable signal on line 187. Thus, when the chip enable signal goes low, data on lines Q0–Q7 is asserted as shown at line 188 with either all zeroes or all ones to enter the read mode with the test column selected by high A6. In order to read the data from the test column, the output enable signal is asserted, as indicated at line 187. The data from the test column is read out, as indicated at line 188, after a valid address is supplied on line 184.

Thus, an automatic non-volatile status write circuit with associated test mode circuitry in a non-volatile memory device is illustrated. The device has both engineering and production modes and allows storing status information indicating the success of an endurance cycling, or the number of tests passed by a particular chip during endurance cycling.

Figure 8:
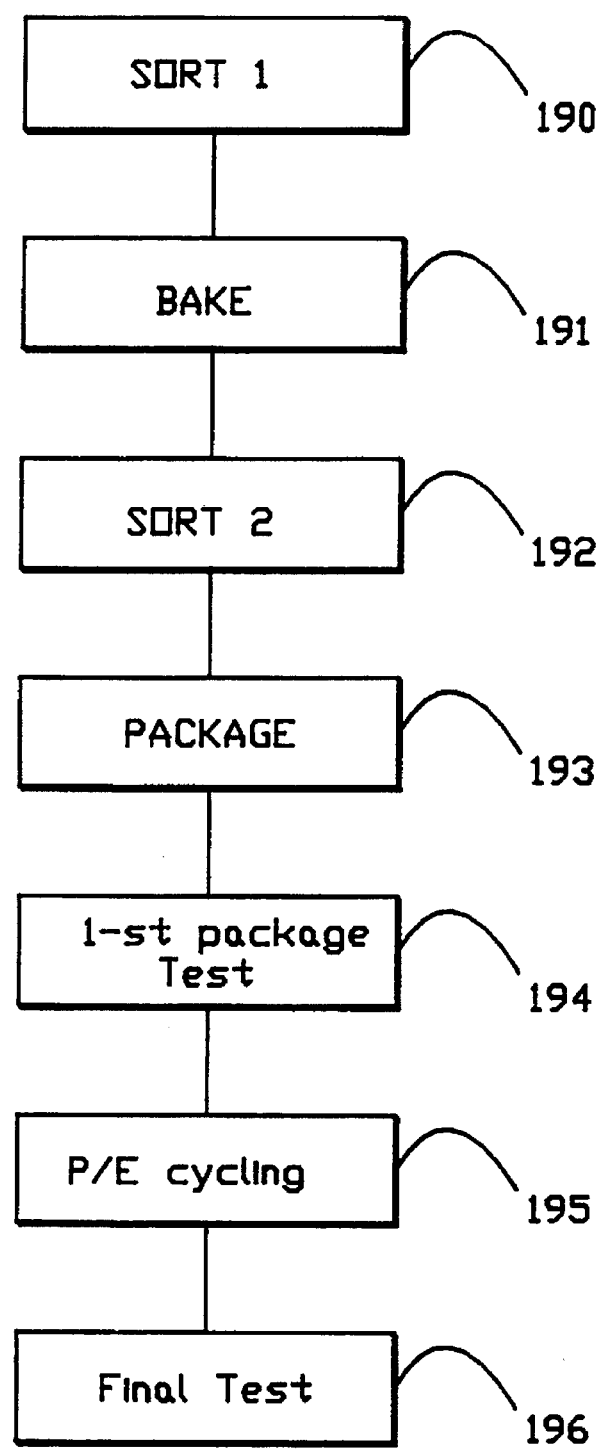
FIG. 8 is a test flow for a non-volatile memory device incorporating the present invention.

FIG. 8 illustrates the test flow for production of an integrated circuit incorporating the non-volatile status write circuitry according to the present invention. This test flow is particularly suited to the non-volatile memory described above with reference to FIGS. 3–7. The test production method involves a first sorting step SORT1, as indicated at block 190, at the wafer level to pick good die within the wafer which pass program and erase operation tests and to program a 00(hex) pattern data in the cells in the device.

The next step involves baking the device, as indicated at block 191. The baking of the device will cause programmed devices with weak retention capabilities to fail. In the SORT2 step (block 192), the devices are selected on the wafer which passed the retention test. After SORT2, the individual die are packaged (block 193). After packaging, a first package test is executed (block 194) to do a functional test of the chip to ensure that the device can be programmed and erased and that the array can be read according to the specified timing. After package tests, the APE endurance cycling is executed (block 195). This cycling tests the endurance of the integrated circuits, and may be programmed as described above for engineering purposes or for production purposes. After APE cycling in block 195, a final test is executed in block 196. During the final test, the test column is read using the timing diagram of FIG. 7, to screen out devices that fail cycling tests. Then a checkerboard pattern is programmed to test the speed grade of the individual devices.

Using the non-volatile status write circuitry according to the present invention, the program/erase cycling 195 can be executed much more efficiently during the manufacture of integrated circuits. Also, the information available from such testing is improved. Overall, the quality and the cost of the integrated circuits manufactured using this technique is improved.

A preferred embodiment of the non-volatile memory device according to the present invention involves FLASH EPROM integrated circuits. A more detailed discussion of the FLASH EPROM implementation is provided with respect to FIGS. 9–13.

Figure 9:
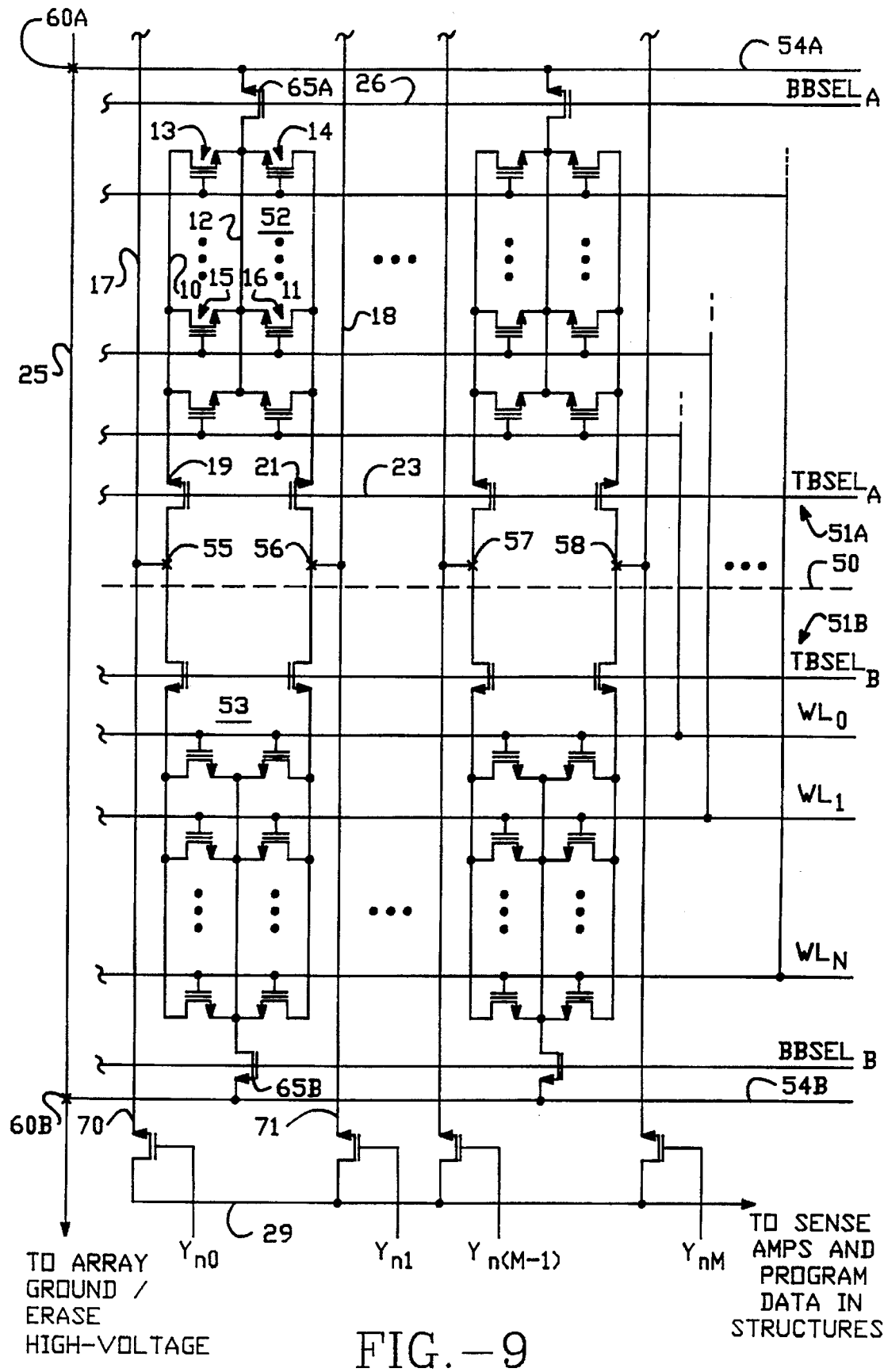
FIG. 9 is a schematic diagram of a segmentable architecture FLASH EPROM array according to the present invention.

FIG. 9 illustrates a segmentable array architecture, using a drain-source-drain configuration of the FLASH EPROM circuit, as described in co-pending U.S patent application Ser. No. 07/823,882, filed Jan. 22, 1992, entitled NON-VOLATILE MEMORY CELL AND ARRAY ARCHITECTURE, owned now and at the time of both inventions by the same Assignee as the present application, and incorporated herein by reference for information about the state of the art.

The circuit includes a first local bitline 10 and a second local bitline 11. The first and second local bitlines 10, 11 are implemented by buried diffusion conductors. Also included is a local virtual ground line 12 implemented by buried diffusion. A plurality of floating gate transistors having gates, drains and sources are coupled to the local bitlines 10, 11 and local virtual ground line 12. The sources of the plurality transistors are coupled to the local virtual ground line 12. The drains of a first column of transistors, generally 13, are coupled to the first local bitline 10, and the drains of a second column of transistors, generally 14, are coupled to the second local bitline 11. The gates of the floating gate transistors are coupled to wordlines $WL_0$ through $WL_N$, where each wordline (e.g., $WL_1$) is coupled to the gate of a transistor (e.g., transistor 15) in the first local bitline 10 and a transistor (e.g., transistor 16) in the second local bitline 11. Thus, transistors 15 and 16 can be considered a two transistor cell with a shared source diffusion.

The act of charging the floating gate is called the program step for the FLASH EPROM cell. This is accomplished on a byte by byte basis through hot electron injection by establishing a large positive voltage between the gate and the source, such as twelve volts, and a positive voltage between the drain and the source, such as six volts.

The act of discharging the floating gate is called the erase step for the FLASH EPROM cell. This is accomplished through F-N (Fowler-Nordheim) tunneling mechanism between the floating gate and the source (source erase) or between the floating gate and the substrate (channel erase). The source erasing is performed by applying a positive bias to the source, such as twelve volts or seven volts, while the gate is grounded or negatively biased, such as minus seven volts. The channel erasing on a block basis is performed by applying a negative bias to the gate and/or a positive bias to the substrate.

A first global bitline 17 and a second global bitline 18 are associated with each drain-source-drain block. The first global bitline 17 is coupled to the source of top block select transistor 19 through a metal-to-diffusion contact 55. Similarly, the second global bitline 18 is coupled to the source of top block select transistor 21 through a metal-to-diffusion contact 56. The drains of the top block select transistors 19, 21 are coupled to the first and second local bitlines 10 and 11, respectively. The gates of the top block selector transistors 19, 21 are controlled by a top block select signal $TBSEL_A$ on line 23.

The local virtual ground line 12 is coupled to a virtual ground terminal across conductor 54A through bottom block selector transistor 65A. The drain of the bottom block select transistor 65A is coupled to the local virtual ground line 12. The source of the bottom block select transistor 65A is coupled to the conductor 54A. The gate of the bottom block select transistor 65A is controlled by a bottom block select signal $BBSEL_A$ across line 26. In the preferred system, the conductor 54A is a buried diffusion conductor which extends to a metal-to-diffusion contact 60A at a position displaced horizontally through the array, which provides contact to a vertical metal virtual ground bus 25.

The global bitlines extend vertically through the array to respective column select transistors 70, 71, through which a selected global bitline is coupled to sense amps and program data-in circuitry (not shown). Thus, the source of column select transistor 70 is coupled to global bitline 17, the gate of column select transistor 70 is coupled to a column decode signal $Y_{n0}$, and the drain of the column select transistor 70 is coupled to conductor 29.

The blocks of FLASH EPROM cells are configured into a plurality of subarrays as illustrated in FIG. 9. FIG. 9 illustrates two subarrays within a larger integrated circuit. The subarrays are divided generally along dotted line 50 and include subarray 51A generally above the line 50 and subarray 51B generally below the line 50. A first group 52 of cells is laid out in a mirror image with a second group 53 of cells along a given bitline pair (e.g., bitlines 17, 18). As one proceeds up the bitline pair, the memory subarrays are flipped so as to share virtual ground conductors 54A, 54B (buried diffusion) and metal-to-diffusion contacts 55, 56, 57, 58. The virtual ground conductors 54A, 54B extend horizontally across the array to a vertical virtual ground metal line 25 through metal-to-diffusion contacts 60A, 60B. The subarrays repeat on opposite sides of the metal virtual ground line 25 so that adjacent subarrays share a metal virtual ground line 25. The metal virtual ground line 25 is coupled to array ground and erase high-voltage circuitry. Thus, the subarray layout requires two metal contact pitches per column of two transistor cells for the global bitlines and one metal contact pitch per subarray for the metal virtual ground line 25.

Furthermore, two or more subarrays as illustrated in FIG. 9 may share wordline signals as illustrated because of the additional decoding provided by the top and bottom block select signals TBSELA, TBSELB, BBSELA, and BBSELB. In the preferred system, each block is configured to include four subarrays in a column, a row in each subarray, sharing a common wordline drivers with rows in the other three subarrays. Decoding amongst the four subarrays is executed using the top block select transistors in response to TBSLEA and TBSELB. Each subarray includes 32 wordlines and 1K (1,024) bitlines. Thus, with four subarrays, 32 wordlines deep, and 1K bitlines wide, a block of 128K cells is provided. Thirty-two blocks makes a 4 megabit memory.

As can be seen, the architecture according to the present invention provides a sectored FLASH EPROM array. This is beneficial because the source and drain of transistors in non-selected subarrays during a read, program or erase cycle may be isolated from the currents and voltages on the bitlines and virtual ground lines. Thus, during a read operation, sensing is improved because leakage current from subarrays not selected does not contribute to current on the bitlines. During the erase operations, the high voltages of the virtual ground line are isolated from the unselected blocks by the BBSEL transistors. For blocks in the same sector, BBSEL has the same voltage level. BBSEL is driven with high voltage to pass array high voltage when the sector flag is set, and with zero volts when sector flag is reset. This allows a sectored erase operation.

Figure 10:
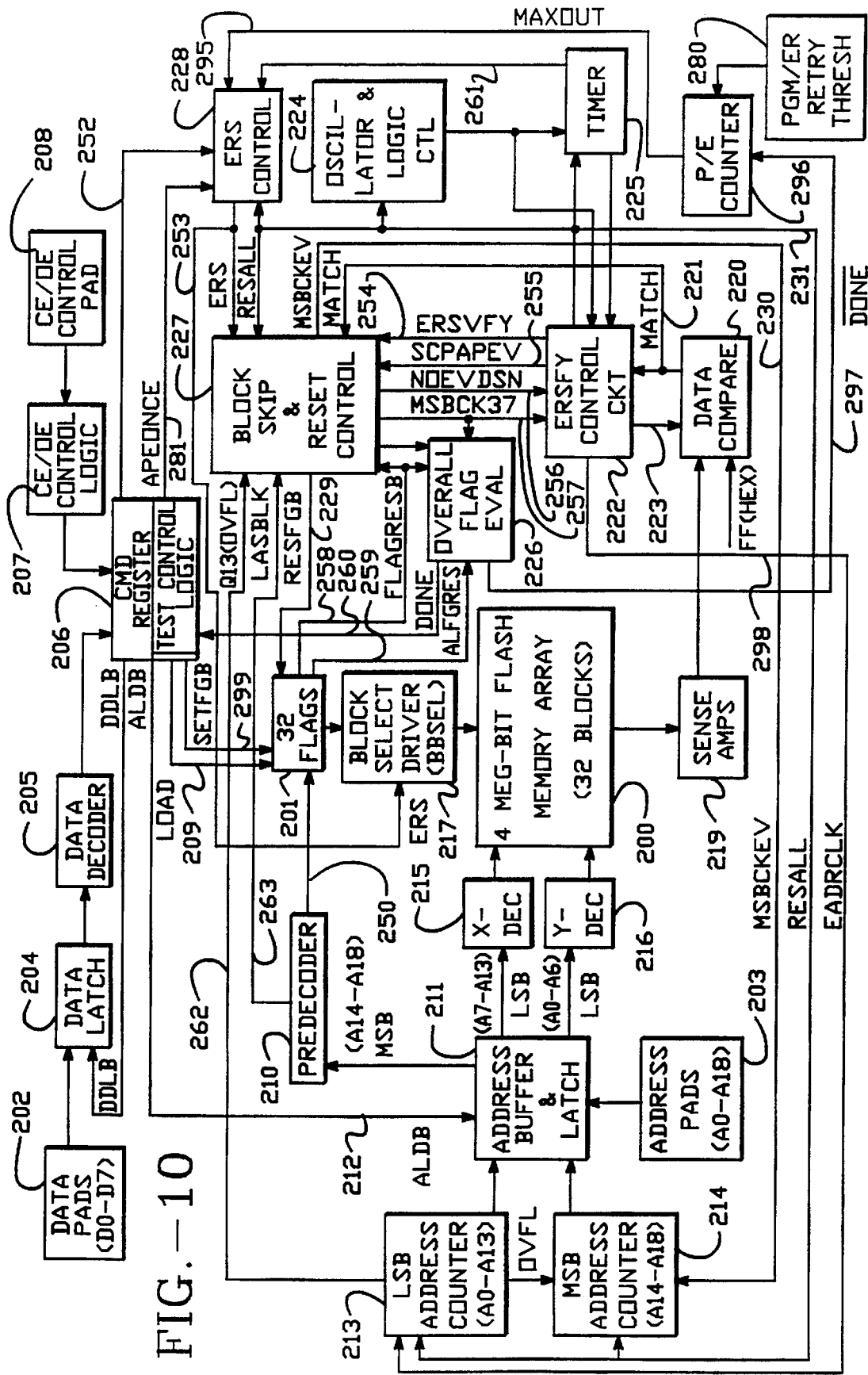
FIG. 10 is a detailed logic diagram of a FLASH EPROM according to the present invention.

FIG. 10 illustrates a more detailed block diagram of the program, program verify, erase and erase verify control for the integrated circuit of the present invention. The circuit includes a 4 megabit flash memory array 200 including 32 blocks in this example. Associated with the 32 blocks in the memory array 200 are 32 flag registers 201. Each of the 32 flag registers 201 corresponds to a particular block in the memory array 200.

The integrated circuit has data pads 202 and address pads 203 for inputting and outputting data and inputting addresses to the chip. The data pads 202 are coupled to a data latch 204. The data latch 204 is coupled to a decoder 205 which drives a command register 206 to set a mode of operation for the chip. Also coupled to the command register 206 are output enable and chip enable control logic 207 which are driven by the output enable and chip enable control pads 208.

When the command register 206 indicates a block erase mode, it issues a load signal on line 209 to the flags 201, and a control signal on line 252 to ERS control logic 228. The flags 201 to be set in response to the load signal on line 209 for a block erase are indicated at the output of predecoder 210 on line 250. Predecoder 210 is driven by the most significant bits out of the address buffer and latch 211. The address buffer and latch 211 in this instance is driven by the signals on the address pads 203 for block erase. Thus, when a block erase mode is set, as part of the command sequence, the address for the blocks to be erased are supplied through the address pads 203. These addresses are predecoded by predecoder 210 to select flags in the flag registers 201 to be set in response to the load signal on line 209. During chip erase operation or APE mode, all flags are set by SETFGB signal on line 299.

The threshold register 280 signals the P/E COUNTER 296 with the selected program and erase retry thresholds set as described in more detail below with reference to FIG. 13.

During sector erase mode operations, the command register 206 issues a control signal on line 212 to cause the address buffer and latch 211 to select the output of the LSB address counter 213 and MSB address counter 214 to drive the array or the address pads 203 during loading, as appropriate. The addresses are supplied through X decoder 215 and Y decoder 216 to address the array. The block select driver 217 is controlled by the flags in flag register 201 for the erase and erase verify mode as indicated from the ERS control logic 228 across line 253.

The ERS control block 228 also controls the high voltage generation during the erase mode in response to inputs on line 261 from the timer circuits 225. The APEONCE signal on line 281 is shown in FIG. 10 as input to the ERS control block 228.

Addressed locations during the verify or read operations are connected to sense amps 219. The output of the sense amps 219 are connected to a comparator 220, which compares the data stored in the address locations to FF (hex), which is expected for an erased cell (00 (hex) for preprogram verify). The MATCH output of the comparator 220 is supplied on line 221 to block skip and reset control circuit 227 when Q13 is high and to the erase verify control circuit 222 which generates the EADRCLK on line 298 to increment the LSB address when Q13 is low. The erase verify control circuit 222 also controls the timing of the comparator 220 as indicated across line 223. Other inputs to the erase verify control circuit 222 include signals from the oscillator and logic control block 224 and from timers 225 which control the timing of critical events in the erase sequence.

Overall flag evaluation circuit 226 receives the MSBCK37 signal from block skip and reset control circuit 227, and the FLAGRESB signal on line 258 and the ALFGRES signal on line 259 from flag registers 201. It supplies the DONE signal on line 260, when all flags have been reset, and the $\overline{\text{DONE}}$ signal on line 297, to increment the P/E counter when all flags have not been reset during an overall flag evaluation interval.

The erase verify control circuit 222 generates the ERSVFY signal on line 254 during an erase verify operation, and the SCPAP/EV signal on line 255 indicating a verify operation for the automatic chip or block erase operation.

The block skip and reset control circuit 227 supplies the NOEVDSN signal on line 256 to the erase verify control circuit 222 and the MSBCK37 signal on line 257 to the erase verify control circuit 222. NOEVDSN is high during flag evaluation to prevent LSB address increment. More details concerning the block skip and reset control circuit 227 are provided below with respect to FIG. 11.

The erase control circuit 228 receives the APEONCE signal on line 281 from the test control logic within the command register logic 206. The block skip and reset control circuit 227 also receives the ERS signal on line 253 and the RESALL signal on line 231 from the ERS control block 228 which is coupled to all of the major logic blocks and used to reset all of the counters, registers and the like in the system. Other inputs to the block skip and reset control block 227 include the Q13 (or OVFL) signal on line 262 generated by the LSB counter 213 when the counter overflows, and the LASBLK signal on line 263 generated by the predecoder 210 indicating the last block on the chip has been accessed.

Other outputs from the block skip and reset control circuit 227 include the RESFGB signal on line 229 used to reset a flag in the flag block 201, and the MSBCKEV signal on line 230 used to signal the MSB address counter 214 to increment to a new block.

The P/E counter 296 generates a MAXOUT signal on line 295, which is connected to erase control block 228. The MAXOUT signal is high when the number of erase or program retries in a given operation exceed the programmed retry thresholds. The programming of the counter may be accomplished by logic which selects a tap output of the counter as the overflow value. This allows programming of the thresholds to values which are a power of two as described below.

The block skip and reset control block 227 is also coupled with the erase verify control circuit and controls resetting flags and the address counters for the state machine.

Figure 11:
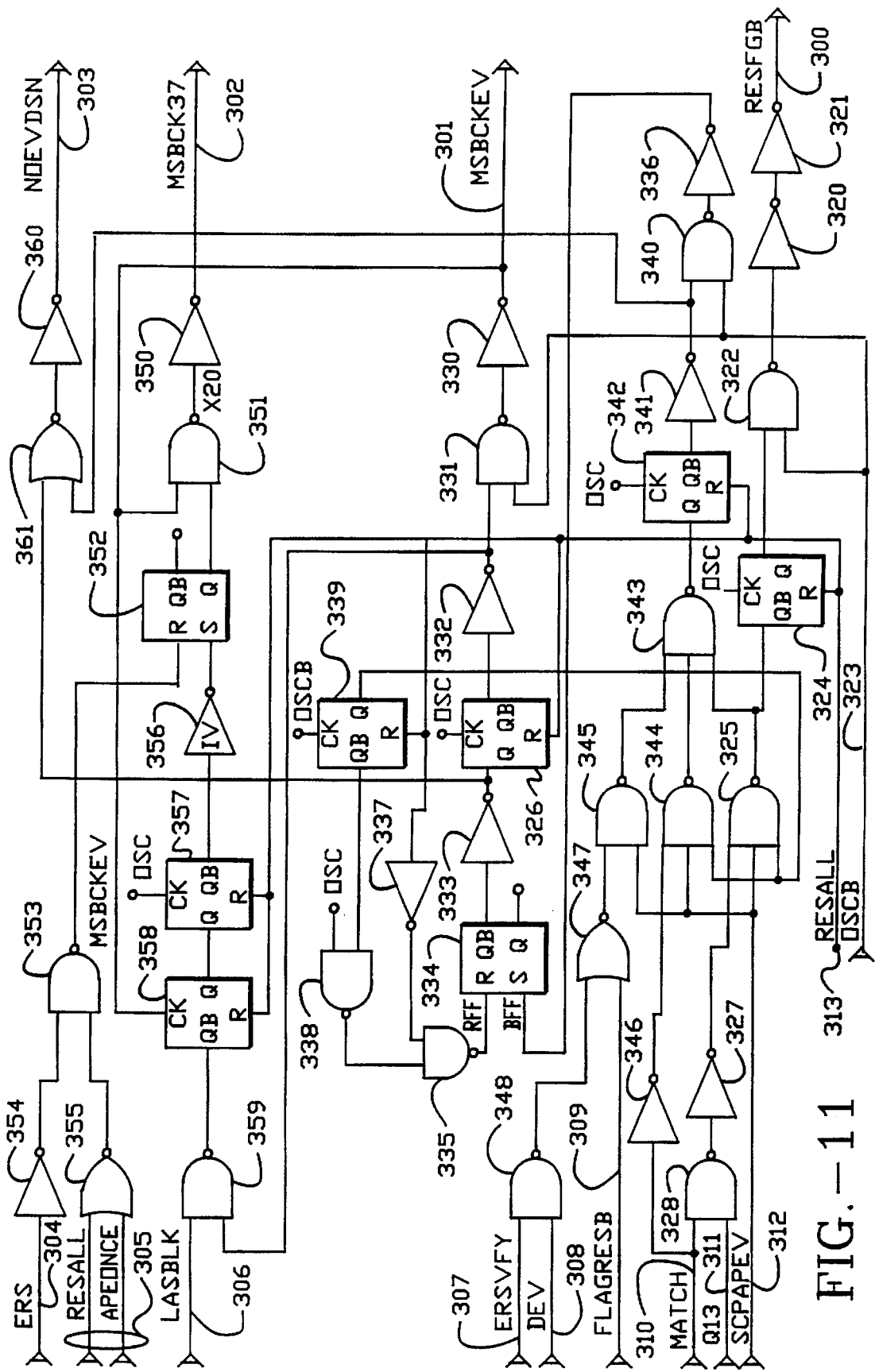
FIG. 11 is a logic diagram of the block skip and reset control block 227 of FIG. 10.

FIG. 11 provides a logic diagram for the block skip and reset control logic 227. The circuit shown in FIG. 11 generates four major control signals for block flag evaluation. These include the RESFGB signal which resets the flag of the block in which all LSB have passed verification on line 300. The MSBCKEV signal on line 301 increments the MSB address counter to move to a new block if the last LSB has verified correctly or if any LSB failed verification, or if a new block has a reset flag. The MSBCK37 signal on line 302 indicates to the state machine that all blocks have been gone through, and it is time to reevaluate flag status. The NOEVDSN signal on line 303 causes the LSB address counter to stop during the flag evaluation period for a new block.

The inputs to the diagram include the ERS signal on line 304 which indicates an erase mode. Also, reset and test signals RESALL and APEONCE on lines 305 are supplied as input. The APEONCE signal is asserted by the command logic (206—FIG. 10) during the automatic program and erase cycling as described above.

Another input is the LASBLK signal on line 306 driven by MSB address counter 214 which indicates that the last block in the chip has been addressed.

The ERSVFY input signal on line 307 is generated during an erase verify operation and the DEV signal on line 308 is generated as a delayed version of the ERSVFY signal for control purposes. The signal FLAGRESB on line 309 is active low when the flag of the selected block has been reset.

The signal MATCH on line 310 is the output of the comparator indicating a pass erase verify for a given address. The signal Q13 on line 311 is an LSB overflow signal indicating that the last LSB in the block has been tested.

The signal SCPAP/EV on line 312 indicates a verify operation for the automatic chip or block erase operation. The RESALL signal is a global reset signal on line 313. Also, inputs to the logic include various oscillators for timing purposes.

The RESFGB signal on line 300 is generated at the output of the string of inverters 320 and 321. The input to inverter 320 is the output of NAND gate 322. The inputs to NAND gate 322 include the oscillator signal OSCB on line 323 and the output of latch 324. The input to latch 324 is the output of NAND gate 325. The inputs to NAND gate 325 include the output of latch 326, the SCPAP/EV signal on line 312, and the output of inverter 327. The input to inverter 327 is the output of NAND gate 328. The inputs to NAND gate 328 include the MATCH signal on line 310 and the Q13 signal on line 311. The latch 326 indicates when it is time to move to a new block. The control signal SCPAP/EV on line 312 indicates the proper mode of operation. The output of NAND gate 328 indicates whether a successful erase verify for the block has occurred. If all these conditions are true, then the reset flag signal RESFGB on line 300 is generated in time with the OSCB signal on line 323.

The MSBCKEV signal on line 301 is generated at the output of inverter 330. The input to inverter 330 is the output of NAND gate 331. The inputs to NAND gate 331 include the OSCB signal on line 323 and the output of inverter 332. The input to inverter 332 is the output of latch 326. Input to latch 326 is the output of inverter 333. The input to inverter 333 is the active low output of SR flip-flop 334. The R input to flip-flop 334 is the output of NAND gate 335. The inputs to NAND gate 335 include the output of inverter 337 which is driven by the RESALL signal on line 313. The other input is the output of NAND gate 338. NAND gate 338 is driven by the OSC signal and by the output of latch 339. The input to latch 339 is the output of latch 326. Thus, the output of NAND gate 335 is a timing signal.

The S input to flip-flop 334 is the output of inverter 336. The driver of inverter 336 is NAND gate 340. The inputs to NAND gate 340 include the OSCB signal on line 323 and the output of inverter 341. Inverter 341 is driven by latch 342. The input to latch 342 is the output of NAND gate 343. Inputs to NAND gate 343 include the output of NAND gate 325, the output of NAND gate 344, and the output of NAND gate 345. The output of NAND gate 344 indicates a failed erase verify by input driven by inverter 346. Inverter 346 is driven by the MATCH signal on line 310. The other inputs to NAND gate 344 include the SCPAP/EV signal on line 312 indicating the proper mode and the output of latch 326 indicating the proper timing.

The output of NAND gate 345 is generated if there is no set flag. This is indicated at the output of NOR gate 347. The inputs to NOR gate 347 include the FLAGRESB signal on line 309 and the output of NAND gate 348. The inputs to the NAND gate 348 include the ERSVFY signal and the DEV signal on lines 307 and 308.

Thus, the MSBCKEV signal on line 301 is driven primarily by the output of inverter 336 which is driven by logic that indicates that there are no set flags, that the current block has had an erase verify failure, or that the current block has passed erase verify.

The MSBCK37 signal on line 302 is driven by the output of inverter 350. Inverter 350 is driven by NAND gate 351. The inputs to NAND gate 351 include the MSBCKEV signal on line 301 and the output of SR flip-flop 352. The R input to flip-flop 352 is driven by NAND gate 353. Inputs to NAND gate 353 include the output of inverter 354 which is driven by the ERS signal on line 304 and the output of NOR gate 355 indicating a test condition. The S input to SR flip-flop 352 is driven by inverter 356. The input to inverter 356 is the active low output of latch 357. Latch 357 is driven by the active high output of latch 358. Latch 358 is driven by NAND gate 359. The inputs to NAND gate 359 include the output of inverter 332 for timing purposes and the LASBLK signal on line 306. Thus, the MSBCK37 signal is generated after all blocks have been passed through by the state machine and it is time to return to overall flag evaluation. MSBCR37 is reset by the RESALL in the erase mode and by APEONCE during APE cycling, to initiate another P/E cycle after erase verify is completed.

The NOEVDSN signal on line 303 is driven by inverter 360. The input to inverter 360 is the output of NOR gate 361. Inputs to NOR gate 361 include the output of inverter 341 and the output of inverter 333. These signals identify the flag evaluation state.

Figure 12A:
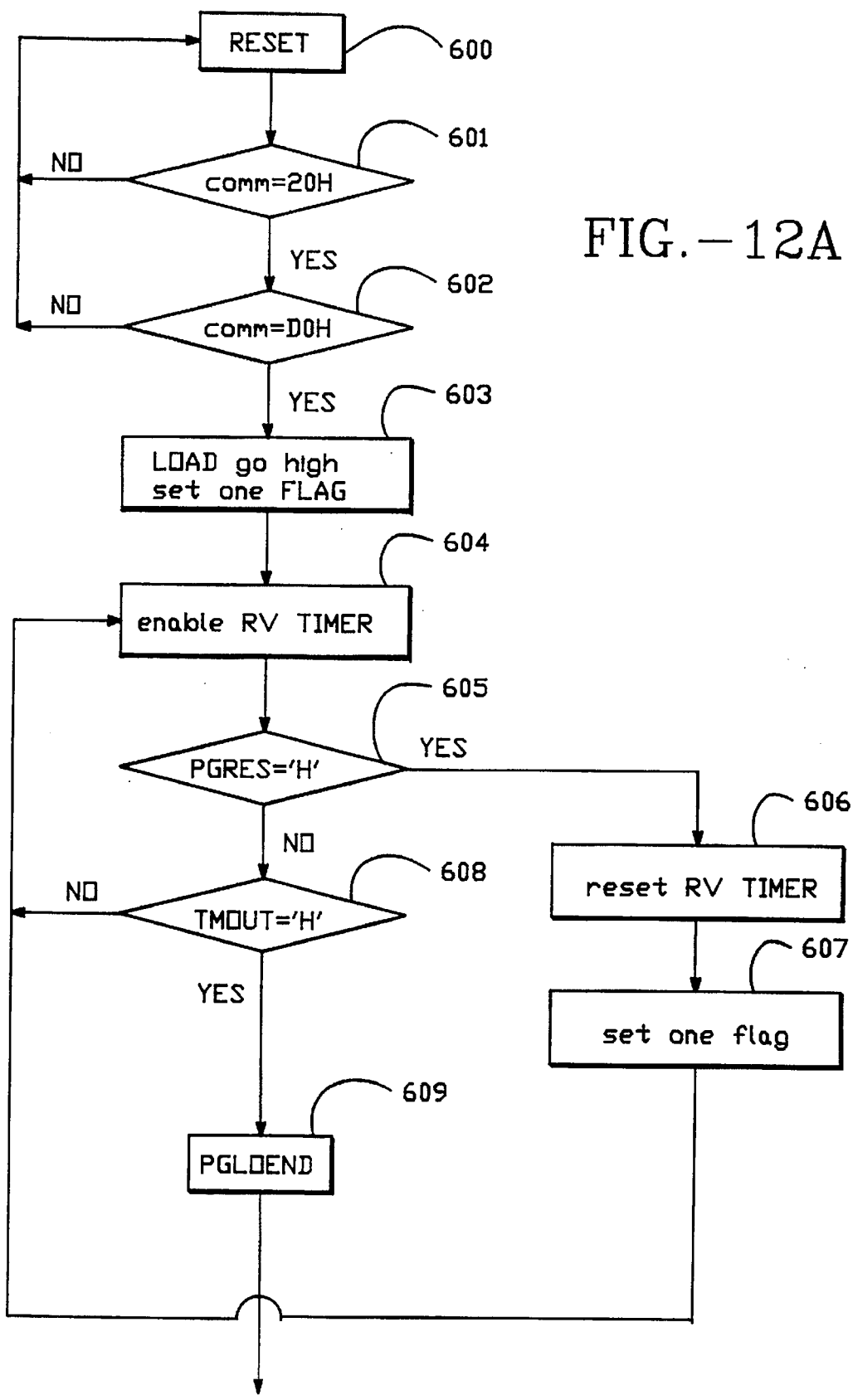

FIGS. 12A–12C provide a detailed flow chart for the automatic sector erase operation according to the present invention, with block level pre-programming, erasing, and verification.

The algorithm begins with a loop consisting of steps 600, 601, and 602 in FIG. 12A waiting for a command consisting of a sequence of a 20(hex) followed by a D0(hex) on the input. Thus, the loop includes a reset step 600, which proceeds to a test for 20(hex) (step 601). If the test fails, the algorithm loops back to the reset step 600. If the test is successful, then the algorithm tests for a D0(hex) in step 602. If the test for D0(hex) fails, then the algorithm loops back to the reset step 600. If a sequence of a 20(hex) word followed by a D0(hex) word is detected at step 602, then the algorithm goes to step 603 to assert the LOAD signal. This results in setting one of the 32 flags in response to a decode of the incoming address. For APE modes, all blocks are selected for program and erase, using a unique command sequence. Also, after erase verify is completed at block 643 (FIG. 12C), APEONCE will initiate another P/E cycle until P/E count is up in fixed count cycling, until hang up for free running modes, or when A1H or A2H goes low for either case.

At this point, a timer is enabled in step 604. Next, the algorithm tests for assertion of the PGRES signal, which indicates that the chip enable goes low during assertion of output enable to signal that the chip should latch another address and set another flag. If the signal is high, then the algorithm loops to step 606 to reset the RV timer, then a flag is set in response to the input address (step 607). At that point, the algorithm loops back to the step 604 to enable the RV timer.

If the PGRES signal is not high at step 605, then the algorithm tests for expiration of the RV timer (step 608). In the preferred system, this is about 100 microseconds. If the timer has not expired, then the algorithm loops to step 604. If the timer has expired, then the PGLOEND signal is asserted at step 609 indicating the ending of the sector address load sequence for latching the blocks to be erased. After step 609, the algorithm loops to FIG. 12B.

In FIG. 12B, the algorithm begins after the set PGLOEND signal in step 609 of FIG. 12A. The flag for block zero is ready for evaluation (step 610) and the P/EVAL is set to indicate the pre-programming flag evaluation interval of the erase mode (step 611).

After the setting of P/EVAL, the FLAGRESB signal is evaluated in step 612. If the signal is zero, then the algorithm determines whether the last block has been evaluated in step 613. If the last block has been evaluated, then the P/EVAL signal is reset in step 614 and the ERS signal is set high in step 615. If at step 613, the last block had not been evaluated, then the MSB counter is incremented in step 654 and the algorithm loops back to step 611 to evaluate the balance of the blocks having set flags.

The FLAGRESB signal is generated by the flag block 201 for the current flag indicated by the signal on line 258 in FIG. 10.

If at step 612, the FLAGRESB was not zero, indicating a set flag, then the algorithm loops to step 616. At step 616, the PGM signal is set high and the P/EVAL signal is reset. This results in supplying the programming potentials to the bitlines, wordlines, and virtual ground terminals in the block to be erased. In one embodiment, four wordlines in respective sectors of the memory are enabled and parallel so that four bytes are pre-programmed in parallel.

After enabling the programming voltages as indicated by step 617, a timer PGMREC1 is enabled to wait for program voltage recovery (step 618). After step 618, program verify voltages are driven (step 619). A second verify timer is enabled for program verify voltage recovery in step 620.

After expiration of the timer in step 620, the logic determines whether the output of the comparator that tests the cells energized during step 619 is high (step 621). If it is high, then the algorithm tests whether Q13 is high in step 621, which indicates that the least significant address counter has overflowed. In an embodiment pre-programming four bytes in parallel, when the two least significant bits (Q12, Q13) are masked, the algorithm tests for Q11, which indicates counter overflow for four byte increments. If it has overflowed, then the algorithm determines whether the last block has been verified (step 623). If the last block has been verified, then PGM is reset in step 624 and the ERS signal is set high in step 625.

If at step 623, the last block had not been programmed, then the algorithm loops to step 614 to increment the MSB counter and proceed to the next block having a set flag.

If at step 622, the Q13 (or Q11) value had not overflowed, then the least significant bit counter is incremented by one (or by four when testing on Q11) and the P/ECNT signal is reset (step 626). Next, the algorithm loops to step 617 to continue programming the block. The P/ECNT signal is a retry counter which is incremented in the event the match signal at step 621 was not high. Thus, if after step 621 the match signal is not high, the algorithm tests whether the retry counter P/ECNT has reached a selected program retry threshold PTHR (block 627). This corresponds to the MAXOUT signal on line 295 of the FIG. 10.

If it had overflowed, then an error is indicated and the algorithm hangs up (step 628). If the counter has not overflowed then it is incremented in step 629 and the algorithm loops back to step 617.

As indicated with respect to FIG. 12B, when the last block has been successfully preprogrammed, the ERS signal is set high, either at step 615 or step 625. After the setting of ERS high, the algorithm loops to the procedure illustrated in FIG. 12C.

As shown in FIG. 12C, the first step is to set up the erase operation by applying the proper erase voltages to the blocks to be erased as controlled to the sources through the bottom block select transistor BBSEL and to the wordlines in an array as shown in FIG. 9 (step 630). After the erase operation, an erase recovery timer is used to allow for recovery of the erase voltages (step 631). After recovery in step 631, the ERSVFY signal goes high and the chip enters an erase verify operation (step 632). Next, the delayed erase verify signal DEV goes high (step 633). At this point, the erase compare latch accepts data from an addressed cell (step 634). After that point, the algorithm, tests for no match, a match and an overflow indicated by the signal Q13, or the FLAGRESB signal being low (step 635). If any one of these conditions is not met, indicating that a successful match on the byte has occurred, or the end of the block has not been reached, or there is a flag still yet to be reset, then the algorithm loops to step 636 where the LSB address is incremented. After step 636, the algorithm returns to step 634 to latch the data from the next byte.

If at step 635 the byte did not verify, or it verified and the address counter had overflowed, or the flag of the block under test had been reset, then the algorithm loops to step 637 where it tests for the successful match with overflow condition. If it is a successful match, then the flag is reset for the block (step 638). After resetting the flag, the algorithm loops back to step 639 where it tests whether the last block has been tested. Similarly, if at step 637 the reason for reaching step 637 was other than a successful match and overflow of the LSB counter, then the algorithm goes to step 639. At step 639, if the last block has not been tested, then the algorithm loops to step 640 where the block address is incremented and the LSB address is reset. From step 640, the algorithm loops to step 634 to begin testing the next block having a set flag.

If at step 639, the last block has been tested, then the algorithm goes to step 641 where the ERSVFY and DEV signals are reset, and a recovery timer is initiated. After expiration of the recovery timer, the ALFGRES signal is tested (step 642). If, in testing the ALFGRES signal, it is determined that all flags have been reset, then the erase operation is complete, and the control circuits reset (step 643). If all flags had not been reset, then the attempt counter P/ECNT (equivalent to MAXOUT signal) is tested (step 644) to determine whether it has exceeded a selected erase retry threshold ETHR, such as 1,024 (8FF hex) set as explained below. If it has exceeded the selected value, then an error has occurred and the attempt is given up (step 645). If the counter in block 644 has not expired, then it is incremented in step 646 and the algorithm loops to step 630 to re-erase blocks that did not pass erase verify.

The P/E counter 296 shown in FIG. 10 is programmable as mentioned above in response to the value in register 280 to set a program retry threshold and an erase retry threshold according to the present invention. This programmable P/E counter can be used to cut down on the testing time for automatic operational modes. Thus, a lower retry threshold can be used during testing for production to speed up manufacture of the devices.

Figure 13:
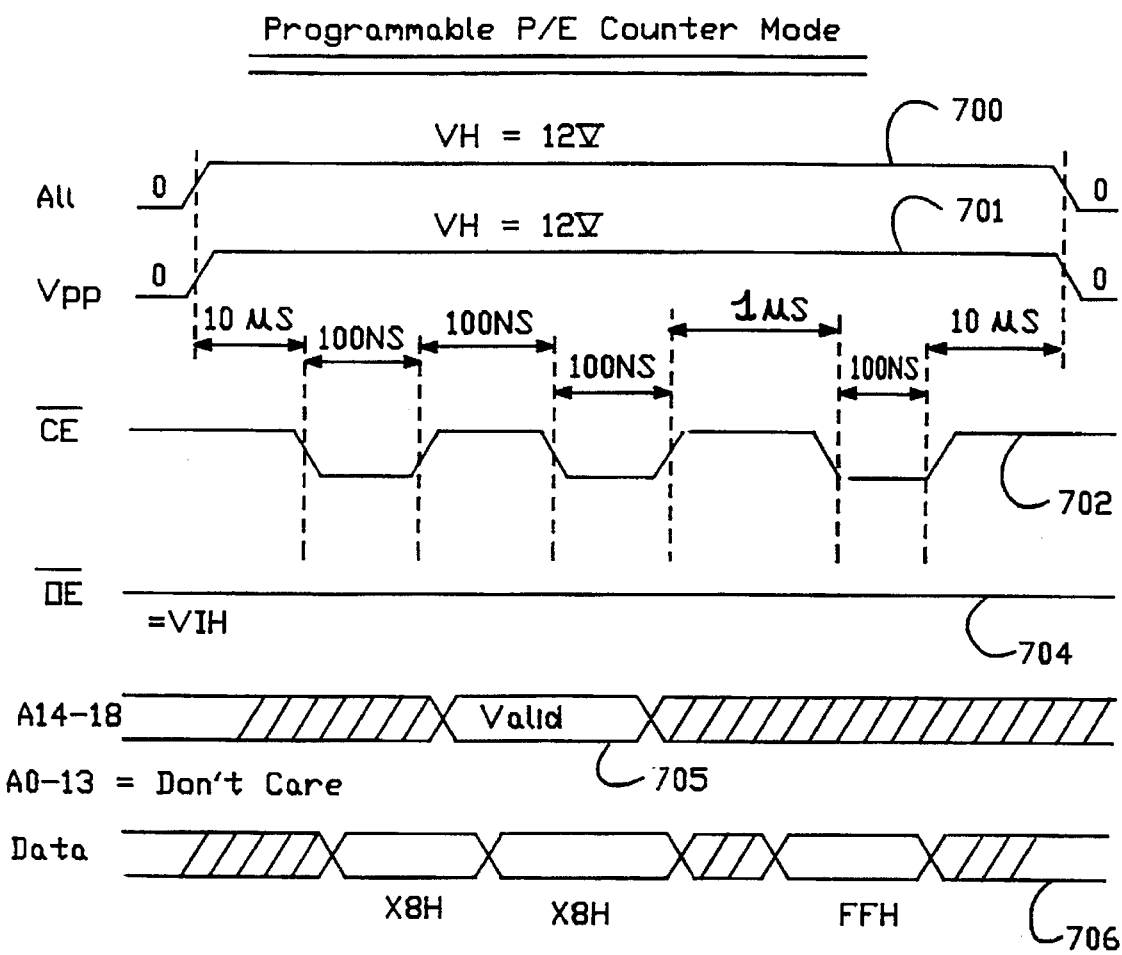
FIG. 13 is a timing diagram illustrating the programming of the program and erase retry thresholds according to the present invention.

Thus, FIG. 13 illustrates the timing diagram used to set a threshold for maxing out the program and erase counter. As indicated, the program mode for the P/E counter retry thresholds is entered by asserting address A11 to the programming potentials indicated at trace 700. Also, the programming potential $V_{PP}$ is asserted high as indicated on line 701. The chip enable and output enable signals are cycled as shown on lines 702 and 704. Thus, chip enable goes high for 10 microseconds, then low for 100 nanoseconds, followed by 100 nanoseconds high, 100 nanoseconds low, 1 microsecond high, 100 nanoseconds low, and 10 microseconds high. The output enable signal is maintained high during this programming of the P/E counter. The programming of the P/E counter is done by setting address bits A14–A16 during the window indicated at 705. Data for the program mode is asserted as indicated along trace 706 as X8(hex) followed by X8(hex) followed by FF(hex).

The retry thresholds in the P/E counter are programmed according to the following table in response to the address signals A14–A16.

TABLE 1

| A14 | A15 | A16 | PGM-MAX | ERS-MAX |
| --- | --- | --- | --- | --- |
| 0 | 0 | X | 32 | — |
| 1 | 0 | X | 16 | — |
| 0 | 1 | X | 8 | — |
| 1 | 1 | X | 4 | — |
| X | X | 0 | — | 2048 |
| X | X | 1 | — | 516 |

The register 280 is reset to a state corresponding to (A14, A15, A16)=(0, 0, 0) by power down $V_{CC}$ to return to a default value. Thus, the user only sees the default count, and the test mode is only used for in house testing.

Conclusion

Accordingly, the present invention provides an integrated circuit which, with improved testing capabilities based upon the use of non-volatile memory in the test circuit. By storing test data in non-volatile memory on chip, the flexibility and power of the testing circuitry can be improved. Also, the speed of testing during production of integrated circuits is vastly improved by providing for the reading of data in an efficient manner during the testing process.

The present invention is particularly suited to implementation in non-volatile memory devices, such as FLASH EPROMs each of which have different program and erase times and which require significant program and erase cycling for both analysis of circuit design and for production purposes.

The foregoing description of preferred embodiments of the present invention has been provided for the purposes of illustration and description. It is not intended to be exhaustive or to limit the invention to the precise forms disclosed. Obviously, many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

What is claimed is:

1. A non-volatile memory integrated circuit, comprising:
    an array of floating gate memory cells, including a port through which data in the array is accessible by external devices;
    a test set of floating gate memory cells in the array;
    program and erase circuitry, coupled to the array, and having a test mode to exercise the program and erase circuitry and generate status information indicating results of the test; and
    non-volatile status write circuitry, coupled to the program and erase circuitry and the test set, which writes the status information to the test set.

2. The integrated circuit of claim 1, wherein the test mode executes a plurality of exercises of the program and erase circuitry and the status information indicates how many of the exercises complete successfully.

3. The integrated circuit of claim 2, wherein the test control circuitry includes:
    logic to enable access to the test set during the test mode;
    a test register, coupled with the program and erase circuitry, to address memory cells in the test set in response to a count of the plurality of exercises; and
    circuits, coupled to the test set, to supply data indicating status of particular exercises in the test mode to corresponding memory cells in the test set.

4. The integrated circuit of claim 2, including logic to program a number of exercises in the plurality of exercises executed in the test mode in response to user input.

5. The integrated circuit of claim 1, further including circuitry, responsive to mode control inputs, to enable read out of the status information.

6. The integrated circuit of claim 1, wherein the test mode executes a plurality of exercises to test endurance of the array and the status information indicates successful completion of the plurality of exercises.

7. The integrated circuit of claim 6, including logic to program a number of exercises in the plurality of exercises executed in the test mode in response to user input.

8. The integrated circuit of claim 1, wherein the program and erase circuitry includes an automatic program and program verify control loop; and wherein
    the automatic program and program verify control loop includes logic to retry a programming exercise in response to failure of program verify, and a retry counter to count retries up to a program retry threshold and signal failure of the programming exercise if the program retry threshold reached, and further includes logic to program the program retry threshold in response to user input.

9. The integrated circuit of claim 1, wherein the program and erase circuitry includes an automatic erase and erase verify control loop; and wherein
    the automatic erase and erase verify control loop includes logic to retry and erasing exercise in response to failure of erase verify, and a retry counter to count retries up to an erase retry threshold and signal failure of the erasing exercise if the erase retry threshold reached, and further includes logic to program the erase retry threshold in response to user input.

10. An integrated circuit, comprising:
    an array of non-volatile memory cells, including a port through which data in the array is accessible by external devices;

program and erase circuitry, coupled to the array, including an automatic program and program verify control loop, and an automatic erase and erase verify control loop to program and erase memory cells in the array; wherein the automatic program and program verify control loop includes logic to retry a programming exercise in response to failure of program verify, and a program retry counter to count retries up to a program retry threshold and signal failure of the programming exercise if the program retry threshold is reached;

the automatic erase and erase verify control loop includes logic to retry an erasing exercise in response to failure of erase verify, and an erase retry counter to count retries up to an erase retry threshold and signal failure of the erasing exercise if the erase retry threshold reached; and logic to program the program retry threshold and the erase retry threshold in response to user input.

11. A method of manufacture for integrated circuits which include functional modules, comprising:

integrating non-volatile status write memory on the integrated circuits;

executing tests of the functional modules which automatically store information indicating results of the tests for each particular integrated circuit on the non-volatile status write memory of such particular integrated circuit; and sorting the integrated circuits in response to data stored in the non-volatile status write memory, the data indicating a speed of the corresponding integrated circuit and the sorting sorts the integrated circuits based upon the speed.

12. The method of claim 11, further including before the step of executing:

mounting a plurality of integrated circuits in a testing apparatus including a processor for automatically testing the plurality of integrated circuits.

13. The method of claim 11, wherein the functional module includes a floating gate memory array with automatic program and erase circuits, and the automatic program and erase circuits include a program retry threshold circuit and an erase retry threshold circuit, further including before the step of executing:

programming at least one of the program retry threshold circuit and erase retry threshold circuit to reduce retries during manufacture.

* * * * *